United States Patent [19]

Kumar

[11] Patent Number: 4,501,768
[45] Date of Patent: Feb. 26, 1985

[54] THIN FILM FLOATING ZONE METAL COATING TECHNIQUE

[75] Inventor: Ananda H. Kumar, Wappingers Falls, N.Y.

[73] Assignee: International Business Machines Corporation, Armonk, N.Y.

[21] Appl. No.: 359,445

[22] Filed: Mar. 18, 1982

[51] Int. Cl.³ .......................... B05D 3/02; B05D 3/12; B05D 5/00
[52] U.S. Cl. ........................................ 427/57; 427/42; 427/96; 427/99; 427/264; 427/266; 427/374.4
[58] Field of Search ................... 427/57, 96, 99, 374.4, 427/98, 264, 265, 266, 42

[56] References Cited

U.S. PATENT DOCUMENTS 3,736,167 5/1973 Bachman et al. ...................... 427/98
4,206,254 6/1980 Schmeckenbecher .......... 427/264 X

OTHER PUBLICATIONS

Glasstone, S., *The Elements of Physical Chemistry*, New York, D. Van Nostrand Company, Inc., 1950, pp. 347-351.
Maissel, L. I. and Glang, R., *Handbook of Thin Film Technology*, New York, McGraw-Hill Book Company, 1970, pp. 1-73-1-80.
Gordon, P., *Principles of Phase Diagrams in Materials Systems*, New York, McGraw-Hill Book Company, pp. 139-142.
Hansen, M., *Constitution of Binary Alloys*, New York, McGraw-Hill Book Company, 1958, pp. 219-222 and 1029-1030.

*Primary Examiner*—Evan K. Lawrence
*Attorney, Agent, or Firm*—Henry Powers

[57] ABSTRACT

A method of coating or cladding existing metallurgical features of a dielectric substrate by sequentially blanket coating the substrate, inclusive of the metal features, with discrete levels of diverse metals forming alloy systems exhibiting a minimum in the liquidus curve, followed by heating the substrate to a temperature ($T_H$) at or slightly above the lowest liquidus temperature in the phase diagram of the alloy system and below the melting points of the metal components. During heating to temperature, the metals interdiffuse forming a range of compositions changing with time to form liquid alloys which moves to the substrate surface where it wets and bonds to the metallic features while dewetting the bar substrate surface portions. On cooling the non-adhering portions the alloy can be suitably removed from the substrate surface, as by ultrasonic action, leaving an alloy of the metals strongly bonded only to the pre-existing metallurgical features.

19 Claims, 11 Drawing Figures

THIN FILM FLOATING ZONE METAL COATING TECHNIQUE

RELATED APPLICATIONS

Concurrent U.S. applications Ser. No. 359,469 filed Mar. 18, 1982 by A. H. Kumar and K. V. Srikrishnan for "Selective Coating of Metallurgical Features of a Dielectric Substrate With Diverse Metals", and Ser. No. 359,444 filed Mar. 18, 1982 by A. H. Kumar, for "Maskless Coating of Metallurgical Features of a Dielectric Substrate", U.S. Pat No. 4,442,137.

TECHNICAL FIELD

This invention relates to a method of depositing and bonding metal coatings on an existing metallurgy pattern of a dielectric substrate, and more particularly for coating solderable and brazeable protective coatings on refractory metal conductor features of a ceramic device employed for mounting semiconductor devices thereon.

Accordingly, it is an object of the present invention to provide a novel method for metal cladding or capping existing metallurgical patterns of a dielectric substrate.

It is another object of this invention to provide a novel method of selectively depositing and bonding a diverse metal coating on an existing metal pattern of a dielectric substrate.

A further object of this invention is to provide a novel maskless method for metal coating an existing pattern of a dielectric substrate with a diverse metals or alloy thereof.

A still further object of this invention is to provide a novel method for fabrication of improved metallized dielectric substrate carriers for mounting of semiconductor devices thereon.

It is another object of this invention to provide a maskless method for cladding sintered refractory metal circuit features of ceramic substrates with a solderable and brazeable coating for connection to terminal contacts of an integrated circuit device and to input-/output (I/O) pins.

BACKGROUND ART

The multi-layer ceramic (MLC) technology for fabricating dielectric substrate carriers for integrated circuit/semiconductor package assemblies is well known. Such MLC substrates are produced by preparing a slurry of a suitable ceramic particulates (e.g. alumin), a fugitive resin binder material, a solvent for the resin binder, normally with an included plasticizer; doctor blading the slurry on removable base with subsequent drying to form thin flexible sheets commonly termed ceramic green sheets. The sheets are then punched to form via holes, and the via holes filled with conductive metalliferous (e.g. molybdenum) paste which is also formed into a pattern of conductive lines which will ultimately form the internal circuitry of the MLC. The punched and printed green sheets are selectively stacked on each other into a laminated substrate assembly, as for example, a stack of 15 to 30 green sheets, and the assembly sintered to integrate the sheets and develop the conductor pattern while removing the binder. The resultant fired MLC substrate can then be employed for flip-chip mounting of semiconductor devices which are electrically connected to the internal circuitry of the MLC substrate.

External contact with the MLC substrate is made by a plurality of I/O pins normally brazed or otherwise mounted to the opposite side of the MLC substrate to the internal circuitry thereof. It is desirable that the MLC substrate be formed with vias and lines densified in accordance with the corresponding microminiturization of the integrated circuit developments. Such microminiaturization is desirable in order that the package be compatible with the corresponding densified integrated circuit device chips mounted thereon. In such application the MLC substrate must be provided on the top surface with many small pads which are capable of making registered electrical contact with corresponding closely spaced semiconductor device terminals, e.g. solder mounds. In order to more efficiently use the modern integrated circuit technology, as many as possible integrated circuit devices are supported on and interconnected within the MLC substrate. Such an arrangement keeps the distances between interconnected devices small and thereby minimizes the time it takes for electrical signals to travel between the interrelated devices. Also this reduces the number of electrical connections which must be made thereby reducing the cost of the package and increases reliability. The end result is a highly complex MLC package with a lot of small internal printed circuitry contained in a substrate carrier capable of mounting large numbers of integrated circuit devices.

Further, such MLC substrates require a relatively complex metallurgy on the topside to make electrical connection to integrated circuit devices and to provide engineering change pads, and on the bottom side to make connection to the I/O pads, pins or other type connections. When green ceramic is sintered there is normally a 17 to 20% shrinkage. Frequently, the shrinkage is not uniform throughout the MLC substrate. Since the substrate is relatively large, and the metallurgy geometry quite small, it is difficult and frequently impossible to produce a mask for coating protective diverse metals on the substrate metallurgy, that is 17 to 20% smaller than the original substrate that will have all open areas that will coincide or register with the substrate metallurgy. Such a mask is necessary for depositing additional metallurgy metals using conventional masking techniques. Usually the original metallurgy pattern on the MLC substrate laminate deposited prior to sintering and comprises a refractory (for example molybdenum) metalliferous paste screened on the laminate sheets. After sintering, the refractory metal (e.g. molybdenum, tungsten, etc.) must not only be protectively covered with different metals, as for example nickel, chromium, copper, gold, etc., but also to facilitate the making of connections, as by soldering, to semiconductor devices, compression bonding to wires and/or brazing to I/O pins. The protective coating of the refractive MLC substrate metallurgy, where molybdenum is employed is important, since molybdenum is susceptible to reactive corrosion when exposed to humidity of any pH value at operating potentials common in MLC module or substrate applications. This corrosion interrupts conductors, and leads to module failure.

One method of protecting the substrate metallurgy is by covering them with diverse metals, e.g. nickel, by electroless plating techniques which do not require masks. However, such coatings are usually thin and may contain impurities such as phosphorous boron, etc., which may be objectionable in subsequent joining (e.g. soldering, brazing, compression bonding, etc.).

The protective metal layers can also be deposited by electroplating techniques. However, such plating techniques require electrical connection to each area to be plated, whereas in MLC substrates such connections are not always available, since some pads or portions of the metallurgy pattern can be "electrically floating".

These electroless and electroplating techniques are expensive time consuming and difficult to control; and thus there is a need for a maskless plating technique which is simple with elimination of processing steps as well as having a significant improvement in yield without problems of phosphorous and/or boron contamination.

BRIEF DESCRIPTION OF THE DRAWINGS

In the accompanying drawings forming a material part of this disclosure.

DISCLOSURE OF THE INVENTION

For further comprehension of the invention, and of the objects and advantages thereof, reference will be had to the following description and accompanying drawings, and to the appended claims in which the various novel features of the invention are more particularly set forth.

The present invention provides a maskless technique for replacing conventional electroless and electroplating methods of coating diverse metals on existing metallurgical features of a dielectric substrate. The invention enables the selective coatings of surface metal features of dielectric substrate with a cladding of diverse metals or their alloys to obtain desired characteristics such as solderability, brazeability and/or corrosion resistance. The coatings are formed first by blanket deposition over the substrate, inclusive of existing metallurgical pattern features, with pattern definition occuring solely due to a subsequent heat treatment in a suitable ambient.

Figure 2:
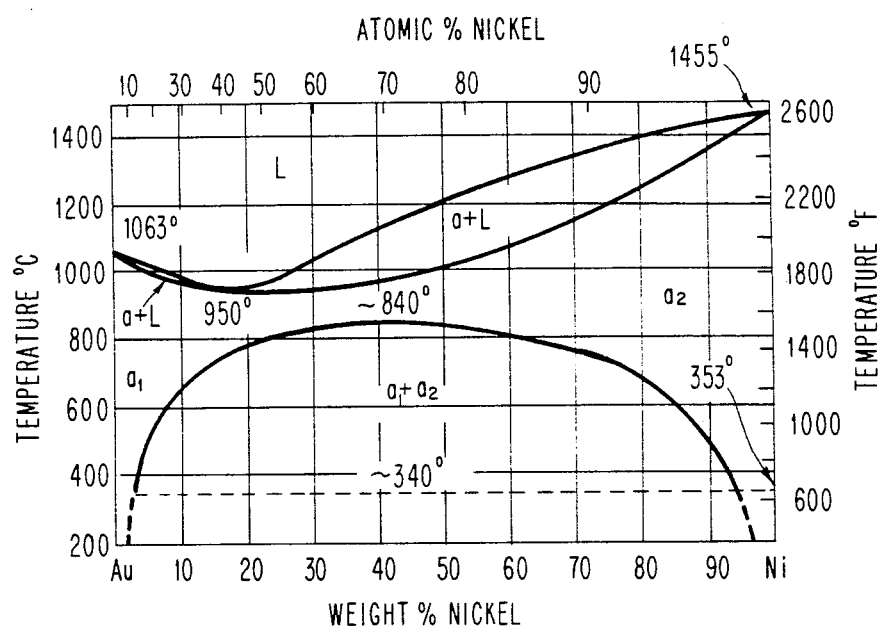
Figure 3:
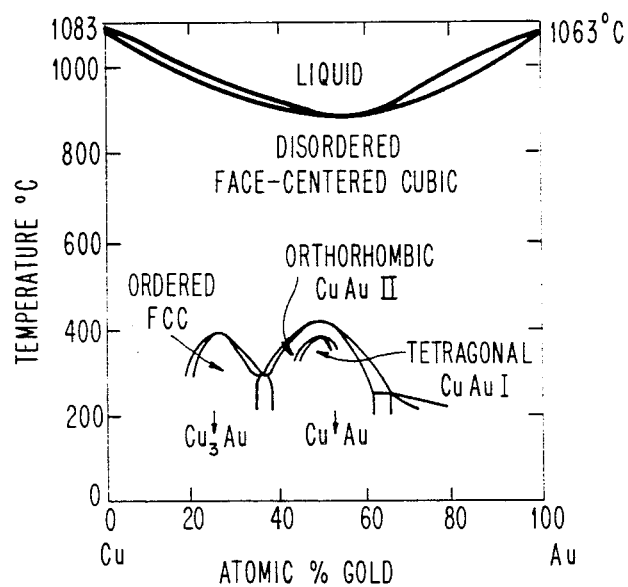
Figure 4:
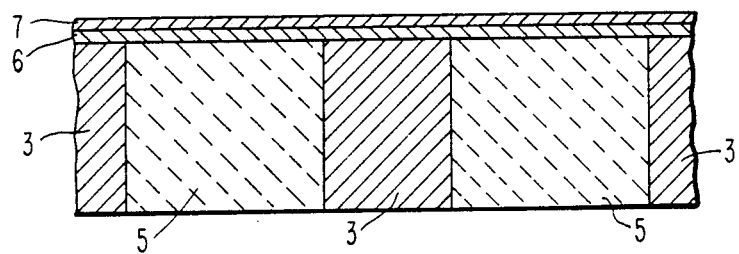
FIGS. 4 to 8 are schematic cross-sectional views showing various stages of the method of this invention.

For bimetallic coatings as shown in FIG. 4, two suitable alloyable metals are chosen which form a continuous series of solid solutions exhibiting a minimum in the liquidus curve. Illustrative of these systems are the combinations Pd/Ni, Au/Ni and Au/Cu as shown in their respective phase diagrams of FIGS. 1-3. These metal systems when molten, dewet the substrate surface with good wetting and adhesion to the metallurgical pattern surfaces. The coated substrate is heated to a temperature ($T_H$) above the lowest liquidus temperature of the metal coatings but below the melting points of either pure metal component. Due to heating, the metal coatings interdiffuse to form a range of compositions which are changing with time. The thin layer in the dual coating whose composition can melt below $T_H$ becomes liquid, and with time this molten zone can move up or down; and when it reaches the surfaces of the substrate and the metallurgical pattern, localized selective adhesion is obtained, e.g. on the pattern but not on the bare substrate surfaces. At this point the surface tension of the liquid zone causes a metal film to strongly braze or bond to the metallurgical pattern and to debond from the bare substrate surfaces, from which, after cooling, it can be mechanically removed as by wire brushing, light sand blasting and, preferably, ultrasonically.

For example, in application to the semiconductor art utilizing an alumina MLC substrate having molybdenum based circuit features, the specifically noted alloy system are particularly advantageous. Illustrative of these systems is palladium and nickel which forms an excellent brazing alloy for molybdenum, since it is solderable and brazeable while providing effective corrosion resistance for molybdenum. The heat treatment can be effected at a $T_H$ of about 1250° to about 1300° C., which can be accommodated in the temperature hierarchy of the processes and materials of the MLC. The temperature of heat treatment is chosen by reference to the phase diagram, as for example FIG. 1 for Pd/Ni system. This temperature should be at or slightly above the lowest liquidus temperature in the system, which for the Pd/Ni system is 1250° C. at a 60% Pd/40% Ni composition. The heat treatment temperature for these metal systems should lie above the liquidus line in the system but not exceed the melting points of either pure metal component.

Figure 5:
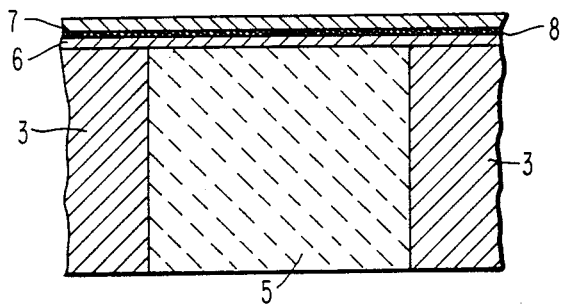
Figure 6:
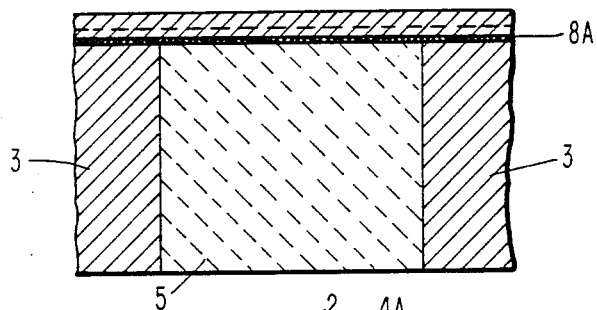

During heat treatment of the illustrative Pd/Ni system, the component metals interdiffuse forming a series of solid solutions across the coating thickness. When a particular segment of this interdiffused region attains the composition 60% Pd/40% Ni, this segment will become liquid. As the interdiffusion continues, the thin liquid zone 8 (FIG. 5) initially formed at the Pd-Ni interface will further enrich itself with palladium or nickel causing it to freeze. However, another segment in the diffusion zone will now be at the critical composition and will melt. This dynamic process continues repeatedly, with the effect of moving a thin liquid zone 8 gradually towards the substrate surface, to, in effect, form a floating zone moving to the substrate, see 8A, FIG. 6.

Figure 7:
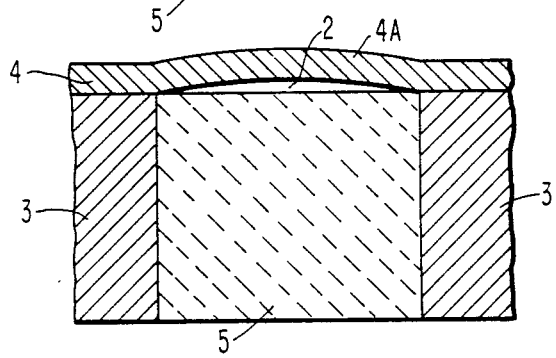
Figure 8:
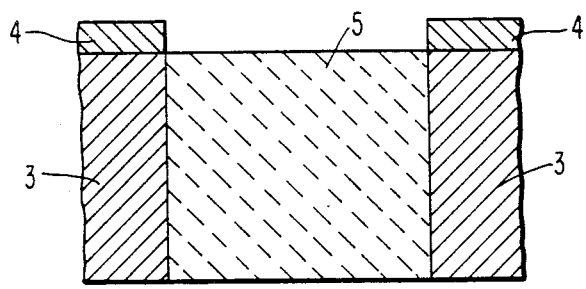

When this floating zone (FIG. 6) reaches the surface of the existing metallurgy (e.g. molybdenum) of the substrate, it will wet the metal and cause the alloy deposit to braze to it. However, when simultaneously the liquid zone reaches the bare or unpatterned substrate surfaces, it will dewet from the surface (e.g. alumina ceramic), and the strong tension forces will cause the deposit to debond from the surfaces (FIG. 7). The debonded metal layer portion 4A from the ceramic surface 2 can be easily removed, as by brushing and, preferably, ultrasonic cleaning in which only the metallurgical pattern 3 will be selectively coated with an adherent Pd/Ni alloy layer 4 (FIG. 8).

BEST MODES FOR CARRYING OUT THE INVENTION

Referring to FIGS. 4 to 8, there is shown a fired ceramic substrate 5, typically an alumina based multilayered ceramic substrate which can be produced by the method described in detail in U.S. Pat. No. 3,518,756. Although FIGS. 4 to 8 are illustrated in broken section, the internal metallurgical conductor pattern is not shown in detail since it does not constitute a material part of the invention. Also, it is to be understood, however, that substrate 5 need not be a multilayer ceramic substrate, but could be solid with the metallurgical pattern formed entirely on the surfaces. However, for this embodiment a portion of the metallurgical pattern, of an MLC, is shown in the context of via extensions or studs 3, which can be formed of a refractory based metal, such as molybdenum which was deposited in a via of the substrate 5 before its firing. The material of the substrate 5 is typically formed of alumina or alumina plus other materials (such as glass), or a ceramic glass material.

The substrate 5, inclusive of the metallurgical features 3, are blanket coated in an E-beam evaporation system sequentially with 1–5 $\mu$m thick coatings of a nickel film 6 and a palladium film 7, in that order. However, as noted above, the dual coatings can comprise other systems, such as Au/Ni, Au/Cu, which conform to this invention. The thickness of the films need not be the same, and each may vary in thicknesses of about 1 to about 5 $\mu$m.

Figure 1:
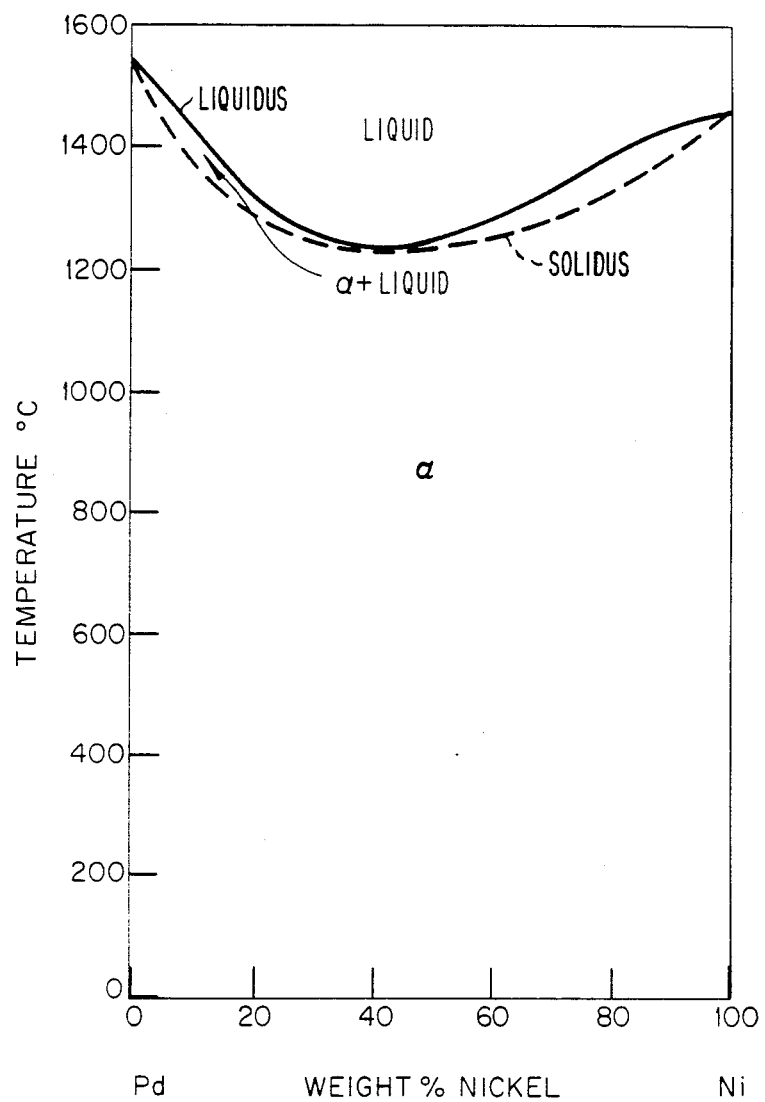
FIGS. 1 to 3 are phase diagrams of, respectively, palladium/nickel, gold/nickel and copper/gold alloy systems.

The composite metal nickel/palladium 6/7 coated substrate is subsequently heat treated in an $H_2$ ambient at temperatures of 1300°–1350° C. which is slightly higher than the lowest liquidus temperature of about 1250° C., and below their respective melting points of 1453° C. and 1552° C., see FIG. 1, holding at this peak temperature for 2 hours. Although most thin metallic films (in the micron range), evaporated or sputtered, exhibit poor discrimination in adhesion between the substrate surfaces (e.g. ceramic) and the metallurgical pattern (e.g. molybdenum) liquid metals and their alloys (e.g. Cu, Cu/Pd, Au etc.), on the other hand wet the metallurgical pattern (Mo) and dewet the substrate (e.g. ceramic) substrate. The layer thicknesses of Pd and Ni and the peak heat treatment temperatures will be so chosen that the latter lies safely below the solidus point for the completely homogenized Pd-Ni alloy that results.

Figure 9:
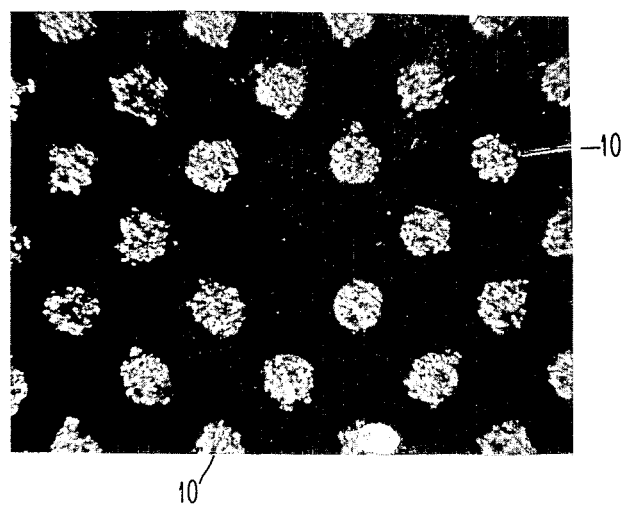
FIG. 9 photographically shows the maskless coating of this invention to a metallurgical via pattern of a dielectric substrate.
Figure 10:
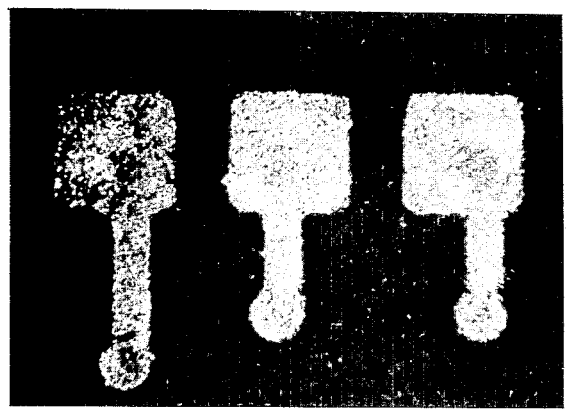
FIG. 10 photographically shows the maskless coating of this invention to engineering change (EC) pads of a dielectric substrate).
Figure 11:
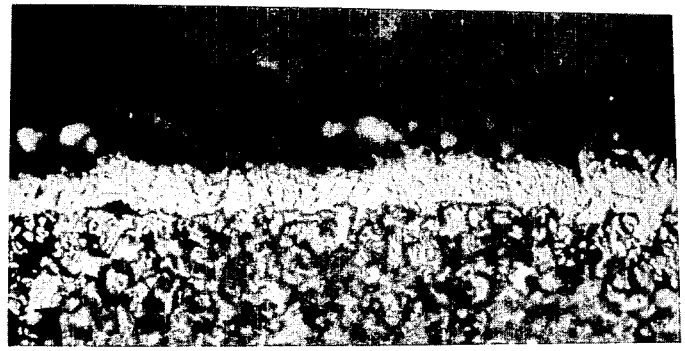
FIG. 11 photographically shows a cross-section through a via metallization of a dielectric substrate.

On cooling of the substrate a layer of palladium-nickel alloy will remain over the surface of the substrate, this layer having become strongly adherent to the refractory metal features in the substrate while delaminating from the bare ceramic areas of the substrate surface. The delaminated portions of the alloy film can be easily detached from the surface by light sand blasting, wire brushing or ultrasonic cleaning. The results are displayed in FIGS. 9 and 10 which, respectively, show the via regions and EC pads, of a sample, showing Pd/Ni coated molybdenum circuit features and the absence of any bridge in between the conductors. FIG. 11 shows a cross-section through a via 10 confirming the formation of a continuous adherent layer of Pd/Ni alloy.

The ultrasonic cleaning can be effected by conventional methods utilizing suitable mediums in a conventional tank type of cleaners having side and or bottom mounted transducers. The mechanism of film removal in ultrasonic cleaning involves the rupturing of the loose metal film 5 from the substrate areas by the action of the shock waves impinging on the surfaces. The shock waves being induced by bubble collapse (cavitation) within the liquid medium during the ultrasonic action. One preferred form of removing the metal film 5 is by use of an ultrasonic horn to focus and deliver very high local intensities of energy (about 100 watts per $cm^2$) and by utilizing the near field characteristics of the ultrasonic field close (e.g. about 1 to about 10 mm) to the horn surface where cavitation plays only a minor role. Under such conditions, the removal of the loosely adherent metal films 5 from the substrate surface is very efficient. For example, non-adhering palladium-nickel films of 5 $\mu$m thickness can be removed from alumina ceramic surfaces in about 5 to about 30 seconds.

It is believed that the mechanism of metal film removal is as follows: In the near-field region, there exists a coupling of the ultrasonic field (generated by the transducer) to the surface of the substrate carrying the metal film. Where the metal film 5 is strongly adhering to the substrate, such as in areas of the pre-existing metallurgical circuit features under the film, the ultrasonic energy is merely transmitted through the metal film 5 into the substrate and dissipated. Where the metal film 5 is non-adhering, such as on the bare substrate surface areas, the ultrasonic energy is substantially absorbed by the thin metal film 5, causing it to vibrate with the field. This vibration generates alternating stresses at points of the film where it adheres to the substrate which eventually causes the film breakage at these points. High frequencies (e.g. 10–40 KHz) of the field ensures that from $10-40 \times 10^3$ cycles of alternating stress is applied to the metal film 5 at the boundaries of adhering regions so that the fatigue limit for the film is reached (in 1 to 30 seconds) depending on the nature of the metal film, its thicknesses, and the distance between adjacent adhering areas. With the complete removal of the non-adhering metal film 5 from the substrate surfaces, only the pre-existing metallurgical circuit features 2A on the substrate will retain an adherent metal film 6/2A, as shown in FIGS. 8 to 11.

While the invention has been illustrated and described with reference to preferred embodiments of the invention, it is to be understood that the invention is not to be limited to the precise construction herein disclosed and the right is reserved to all changes and modifications coming within the scope of the invention as defined in the appended claims.

Having thus described the invention, what is claimed as new and desired to be secured by Letters Patent is:

1. A method of selectively depositing brazeable and solderable coatings over an existing metallurgical pattern of a dielectric substrate, comprising:

sequentially blanket coating said substrate, inclusive of said pattern, with discrete levels of two diverse alloyable metals capable of forming a continuous series of solid solutions and showing a minimum in the liquidus curve in their phase diagram to form brazeable and solderable with the alloys of said metals bondable to said pattern and non-wetting to the bare surfaces of said substrate, heating said substrate to a temperature below the melting points of said metals and above the lowest liquidus temperature in the phase diagram of the alloy system of said metals, with said heating being maintained for sufficient time to obtain interdiffusion of the component metals to form an alloy composition, at the interface with the substrate, corresponding to the composition of the said lowest liquidus temperature in the phase diagram of the component metals, whereby said alloy of said metals contacts and is bonded to said pattern and dewets the bare surfaces of said substrate to form loosely adhered alloy segments thereon;

cooling said substrate to solidify said coating and said segments thereon; and removing said segments from said bare surfaces of said substrate with retention of a brazeable or solderable alloy coating formed on said pattern.

2. The method of claim 1 where said segments are ultrasonically removed from said bare surfaces of said substrate.

3. The method of claim 1 wherein said metallurgical pattern is comprised of a refractory metal.

4. The method of claim 3 wherein said refractory metal is molybdenum.

5. The method of claim 1 wherein said substrate is comprised of an alumina based ceramic.

6. The method of claim 5 wherein said metallurgical pattern is comprised of a refractory metal.

7. The method of claim 6 wherein said refractory metal is comprised of molybdenum.

8. The method of claim 7 where said segments are ultrasonically removed from said bare surfaces of said substrate.

9. The method of claim 7 wherein said metals are selected to form Pd/Ni, Au/Ni or Au/Cu binary alloy systems.

10. The method of claim 9 where said segments are ultrasonically removed from said bare surfaces of said substrate.

11. The method of claim 7 wherein said metallurgical pattern comprises contact points on the surfaces of said substrate for solder or brazing elements thereto.

12. The method of claim 11 where said segments are ultrasonically removed from said bare surfaces of said substrate.

13. The method of claim 12 wherein said metals are selected to form Pd/Ni, Au/Ni or Au/Cu binary alloy systems.

14. The method of claim 13 where said segments are ultrasonically removed from said bare surfaces of said substrate.

15. The method of claim 5 wherein said substrate is a multilayer ceramic.

16. The method of claim 15 wherein said pattern is comprised of molybdenum.

17. The method of claim 16 wherein said metals are selected to form Pd/Ni, Au/Ni or Au/Cu binary alloy systems.

18. The method of claim 17 where said segments are ultrasonically removed from said bare surfaces of said substrate.

19. The method of claim 1 wherein said substrate comprises a ceramic.

* * * * *